United States Patent [19]
Kongetira

[11] Patent Number: 5,936,873
[45] Date of Patent: Aug. 10, 1999

[54] SINGLE ENDED MATCH SENSE AMPLIFIER

[75] Inventor: Poonacha Kongetira, San Jose, Calif.

[73] Assignee: Sun Microsystems, Inc., Palo Alto, Calif.

[21] Appl. No.: 08/940,298

[22] Filed: Sep. 30, 1997

[51] Int. Cl.$^6$ .................................................. G11C 15/00
[52] U.S. Cl. ............................................. 365/49; 365/203
[58] Field of Search ...................... 365/49, 203; 395/400

[56] References Cited

U.S. PATENT DOCUMENTS

| | | | |
|---|---|---|---|
| 5,222,222 | 6/1993 | Mehring et al. | 395/400 |
| 5,299,147 | 3/1994 | Holst | 365/49 |
| 5,327,372 | 7/1994 | Oka et al. | 365/49 |
| 5,475,825 | 12/1995 | Yonezawa et al. | 365/49 |
| 5,638,315 | 6/1997 | Braceras et al. | 365/49 |
| 5,642,114 | 6/1997 | Komoto et al. | 365/49 |

OTHER PUBLICATIONS

U.S. application No. 08/940,297.

*Primary Examiner*—David Nelms
*Assistant Examiner*—M. Tran
*Attorney, Agent, or Firm*—Conley, Rose & Tayon, P.C.; Eric A. Stephenson

[57] ABSTRACT

A single-ended match sense amplifier is provided for use in a translation lookaside buffer. The translation lookaside buffer includes a CAM array for storing x bit virtual addresses. The CAM array has n rows and x columns of CAM cells, each CAM cell having input node for receiving a virtual address bit signal, and a CAM miss/match node. N rows and minor sense amplifier circuits are coupled to n major sense amplifier circuits via n major sense lines. Each minor sense amplifier circuit has a minor sense input node, and a minor sense miss/match node. Each minor sense line is also coupled to at least two CAM cell miss/match nodes. A minor sense precharging device is coupled to each minor sense line. The minor sense precharging device selectively conducts current to precharge the minor sense lines to a first predetermined voltage. Each of the major sense amplifiers has a major sense input node, and a major sense miss/match node. Each major sense line is coupled to at least two minor sense miss/match nodes and one major sense input node. Major sense precharging devices are coupled to each major sense line. The major sense precharging devices selectively conduct current to precharge the major sense lines to the first predetermined voltage.

26 Claims, 6 Drawing Sheets

SINGLE ENDED MATCH SENSE AMPLIFIER

BACKGROUND OF THE INVENTION

1. Field of the Invention

The present invention relates generally to sense amplifiers. More specifically, the present invention relates to a single ended match sense amplifier.

2. Description of the Relevant Art

Sense amplifiers are used in a number of digital circuit applications to enhance the speed of transition time between changes in logic levels on a given address or data line. Often times, this is accomplished by precharging the data or address line to a high voltage representing a logic one just prior to the transmission of a data or address signal. Proper charging of data or address lines requires a certain amount of time because of RC time constants associated with charging the capacitance of the address or data line. To the extent this can be done by a precharge phase between data cycles, time can be saved. A data or address signal may then be introduced on the line, and the voltage value of the line will be selectively changed (or not) in order to represent the state of the data signal.

In one precharging scheme, binary "0" and "1" bits are represented on the data line by 0 volts and some positive voltage, such as 5 volts. If a "0" n bit is transmitted using the data line, the voltage on the data line will be driven down to 0 volts. Otherwise, if a "1" bit is to be transmitted, the line is left at the higher voltage value.

Sense amplifiers are employed in translation lookaside buffers (TLB) to detect or sense a match between an inputted virtual address and the contents of the translation lookaside buffer. TLBs employ match lines which transmit a match signal indicative of a match between an input virtual address and the TLB contents, or a miss signal indicative of a mismatch between the input virtual address and the TLB contents. Prior to transmission of the match or miss signal, the match lines are precharged to a predetermined high voltage, e.g., 5 volts. This predetermined voltage typically represents a match signal for a subsequent translation cycle. The match or miss signal is then introduced on the sense line, and the voltage value of the line will be selectively changed (or not) in order to represent the results of the input address comparison. Sense amplifiers sense the signal on the match lines, and output a corresponding signal in response.

FIG. 1 is a block diagram of the conventional TLB 10 which stores a set of virtual address/physical address translations. TLB 10 includes a content addressable memory (CAM) array 12 of CAM cells for storing virtual addresses, a first random access memory (RAM) array 14 of RAM 1 cells for storing a plurality of special bits used to qualify the virtual to physical address translation, and a second RAM array 16 of RAM2 cells for storing physical addresses corresponding to virtual addresses stored in CAM array 12.

TLB 10 further includes a plurality of CAM write drivers 20, first RAM write drivers 22, and second RAM write drivers 24. Each of the write drivers 20–24 includes a pair of differential inputs, a control input, and a pair of differential outputs.

Each CAM write driver 20 has a pair of differential outputs coupled respectively to a pair of differential bit lines 30 and 32 within CAM array 12. The differential outputs of first RAM write drivers 22 are coupled respectively to differential bit lines 34 and 36 in first RAM array 14. Differential outputs of second RAM write drivers 24 are coupled respectively to differential bit lines 38 and 40 within second RAM array 16.

The control input of each CAM and first RAM write driver, 20 and 22, respectively, is coupled to a CAM/RAM1 write enable signal line 44. Similarly, each control input of second RAM write driver 24 is coupled to RAM2 write enable signal line 46. In general, the write drivers 20–24 write data to their corresponding storage cells in response to receiving a write enable signal. More particularly, CAM write drivers 20 write virtual address signals in the CAM cells via bit lines 30 and 32 when write drivers 20 receive the CAM/RAM1 write enable signal. First RAM write driver 22 write special bit signals to the RAM1 cells via bit lines 34 and 36 when write drivers 22 receive the CAM/RAM1 write enable signal. Second RAM write drivers 24 write physical address signals to RAM2 cells via differential bit lines 38 and 40 when write drivers 24 receive the RAM2 write enable signal.

TLB 10 further includes CAM read sense amplifiers 50, first RAM read sense amplifiers 52, and second RAM read sense amplifiers 54. Each read sense amplifier has a pair of differential inputs, a control signal input, and a pair of differential outputs.

Each pair of differential inputs to CAM read sense amplifier 50 is coupled to a pair of differential bit lines 30 and 32 within CAM array 12. Each pair of differential inputs to first RAM read sense amplifier 52 is coupled to a pair differential bit lines 34 and 36 within first RAM array 14. Each pair of differential inputs of second RAM read sense amplifier 54 is coupled to a pair of differential bit lines 38 and 40 within second RAM array 16.

Each control input of CAM and first RAM read sense amplifiers 50 and 52, respectively, is coupled to a CAM/RAM1 read enable signal line 58. Each control input of second RAM read sense amplifier 54 is coupled to a RAM2 read enable signal line 60.

In general, each read sense amplifier generates a differential output signal as a function of a differential input signal and in response to receiving a read enable signal. Thus, CAM read sense amplifiers 50 output virtual address signals stored in the CAM cells in response to receiving the CAM/RAM1 read enable signal. First RAM read sense amplifiers 52 output special bit signals stored in the RAM1 cells in response to receiving the CAM/RAM1 read enable signal. Second RAM read sense amplifiers 54 outputs physical address signals stored in RAM2 cells in response to receiving the RAM2 read enable signal.

TLB 10 further includes a plurality of CAM/RAM1 word line drivers 64, and a plurality of RAM 2 word line drivers 66. Each CAM/RAM1 word line driver 64 has an output coupled to a row or line of CAM and RAM1 cells within the CAM array 12 and first RAM array 14, respectively, via word line 68. Each RAM2 word line driver 66 is coupled to a row or line of RAM 2 cells in second RAM array 16 via word line 70. Each CAM/RAM1 word line driver 64 generates a word line signal which activates a row of CAM and RAM1 cells. Word line driver 64 generates the word line signal in response to receiving a line address signal from a word line decoder (not shown). Likewise, each RAM2 word line driver 66 generates a word line signal which activates a row of RAM2 cell in response to RAM2 word line driver 66 receiving a line address signal from the word line decoder.

TLB 10 also includes a plurality of match sense amplifiers 74, each of which is coupled to a line of CAM cells within CAM array 12 via a match line 76. In a translation operation, one of the match sense amplifiers 74 sense when a virtual address inputted to CAM array 12 matches a virtual address stored within a line of CAM cells therein. As is to be noted within FIG. 1, each match sense amplifier 74 is coupled to one of the CAM/RAM1 word line drivers 64 and RAM2 word line drivers 66. When match sense amplifier 74 senses a match signal on match line 76 indicating that an input virtual address matches the contents of a row of CAM cells, match sense amplifier 74 outputs a signal to both CAM/RAM1 word line driver 64 and RAM to word line driver 66. Upon receipt of the signal from match sense amplifier 74, CAM/RAM1 word line driver 64 outputs a word line signal to its respective line of CAM and RAM1 cells. Similarly, when match sense amplifier 74 generates its signal, RAM2 word line driver 66 outputs a word line signal to its line of RAM2 cells.

CAM array 12 includes a plurality of CAM cells 80 arranged in x columns and n rows. Each row of CAM cells 80 stores a single x bit virtual address and, as noted above, is coupled to one of the CAM/RAM1 word lines 68. Each column of CAM cells 80 is coupled to a pair of CAM differential bit lines 30, 32, and a pair of CAM differential virtual address lines 82, 84. Each row of CAM cells 80, as noted above, is connected to one of the match lines 76. In an address translation, a virtual address is input to differential CAM virtual address bit lines 82 and 84. Thereafter, internal circuitry within CAM cells 80 compares the input virtual address with the CAM cell contents. If a row of CAM cells 80 stores an address which equates to the input virtual address, a match signal is provided on the corresponding match line 76. If the row of CAM cells 80 does not store the address corresponding to the input virtual address, a miss signal is provided on the corresponding match line 76.

Generally, each match sense amplifier 74 includes precharging circuitry (not shown) which precharges the match lines before an address translation cycle. The precharging circuitry is defined by a transistor coupled between a supply voltage and match line 76. The gate of the transistor is configured to receive a precharge pulse signal. When the transistor is activated by the precharge pulse signal, the transistor conducts current to charge match line 76 to a voltage substaintially equal to the supply voltage. Once precharged, CAM array 12 is provided with an input virtual address. If the virtual address does not equate to the contents of a row of CAM cells, one or more of the CAM cells will operate to discharge the corresponding match line 76 to a voltage substantially equal to ground, thereby providing a missed signal on match line 76. If the row of CAM cells contains an address equal to the input virtual address, none of the CAM cells within the row will discharge match line 76. Thus, match line 76 should keep its precharged voltage, thereby indicating a match signal. Match sense amplifier 74, is timed to generate an output signal indicative of the voltage on match line 76 at a particular instant of time. It is to be noted that within the prior art, each CAM cell 80 in a row is connected to a corresponding match sense amplifier 74 via a single sense line 76.

First RAM array 14 includes a plurality of RAM1 cells 88 arranged in N rows and y columns. Each row of RAM1 cells 88 stores n special bits associated with a virtual address stored in the corresponding line of CAM cells 80. Each row of RAM1 cells 88 is coupled to one of the word lines 68, and thus one of the CAM/RAM1 word line drivers 64. Each column of RAM1 cells 88 is coupled to corresponding pair of differential first RAM bit lines 34 and 36.

Second RAM array 16 comprises a plurality of RAM2 cells 98 arranged in N rows and Z columns. The RAM2 cells 98 are substantially similar to the RAM1 cells 88. Each row of RAM2 cells stores a single z bit physical address. Each row of RAM2 cells 98 is coupled to one of the RAM2 word line drivers 66 via word line 70. Each column of RAM2 cells 98 is coupled to a corresponding pair of differential RAM2 bit lines 38 and 40. When one of the match sense amplifiers 74 detects a match of an input virtual address, the match sense 74 issues a corresponding signal to its associated RAM2 word line driver 66 and CAM/RAM1 word line driver 64, which in turn generates a word line signal to its corresponding rows of RAM2 cells 98 and RAM1 cells 88. In response, the corresponding row of RAM2 cells 98 output their physical address contents to differential bit lines 38 and 40, and the corresponding row of RAM1 cells output their special bits to differential bit lines 34 and 36 . Read sense amplifiers 54 and 52 receive the physical address and special bits at their differential inputs, and acting in response to RAM2 and CAM/RAM2 read enable signals, output the physical address and special bits, which are concatenated and used to access the computer's main memory (not shown).

As noted above, TLB 10 stores the most recently used virtual address/physical address pairs. Often times, TLB 10 must be updated with new virtual address/physical address pairs. TLB 10 is provided with read and write access modes to accomplish content updating. In one write access mode, CAM and first RAM write drivers 20 and 22, respectively, charge differential bit lines 30–36 as a function of data signals received at their inputs, and in response to CAM/RAM write enable signal. Thereafter, one of the CAM/RAM1 word line drivers 64, operating in response to a received line decode signal, generates a word line signal received by a corresponding line of CAM cells 80 and RAM1 cells 88. In response, the line of activated CAM cells 80 and RAM cells 88 store the values on differential lines 30–36. In a read operation, one of the CAM/RAM1 word line drivers 64 again receives a line decode signal and generates a word line signal which activates a row of CAM cells 80 and RAM1 cells 88. In response, the activated CAM cells 80 and RAM1 cells 88 output their stored contents onto differential bit lines 30–36. CAM read sense amplifiers 50 and first RAM read sense amplifiers 52 detect the voltage values at their inputs, and in response to a CAM/RAM1 read enable signal on line 58, generate corresponding values at their outputs. Second RAM array 16 is accessed in a similar fashion. It is to be noted that CAM array 12 and first RAM array 14 are accessed concurrently, while second RAM array 16 can be accessed independently of CAM array 12 and first RAM array 14 access.

Several problems exist with prior art match sense amplifiers 74. In particular, the proper sensing of a match or missed signal on match line 76 is difficult since match line 76 is substantially long and thus loaded with large capacitance. The large capacitance adds a significant time delay in sensing a match or missed signal on sense line 76 by match sense amplifier 74. One prior art solution to the increased time delay is to employ a differential match sense amplifier. Unfortunately, differential match sense amplifiers are significantly more complicated and occupy significant area on the integrated circuit. Differential sense amplifiers are more sensitive to process variations, and thus, less reliable than their single ended counterparts. Thus, single ended match sense amplifiers, as shown in FIG. 1, are advantageous, except for the speed limitations imposed by the large RC time constant of sense line 76.

Another problem associated with the prior art sense amplifier 74 shown in FIG. 1 relates to charge leakage from sense line 76 during a data or address translation compare cycle. FIG. 2 is a timing diagram illustrating the problems associated with charge leakage from sense line 76. At time $t_0$, a precharge control signal is provided to a precharge device (not shown) coupled between a supply voltage and sense line 76. The precharge device operates to conduct the current for precharging line 76 to a voltage substantially equal to the supply voltage. At time $t_2$, the precharge signal is deasserted to a logic high, thereby decoupling the precharge device from sense line 76. Oftentimes, the precharge voltage on sense line 76 begins to degrade due to charge leakage through any one of a number of devices coupled to sense line 76. At time $t_3$ a virtual address is provided to CAM array 12. If the virtual address matches the contents of the CAM cells coupled to the match line represented in FIG. 2, the voltage on sense line 76 theoretically should remain high, thus indicating a match signal condition. However, charge leakage from sense line 76 may cause the voltage thereon to further decline possibly to a voltage level below the sensing level of match sense amplifier 74. This could cause match sense amplifier 74 to sense a missed condition when, in fact, a match condition should exist.

If the virtual address provided to CAM array 12 does not match the contents within the line of CAM cells, the voltage on sense line 76 will discharge to ground through one or more of the CAM cells, thus indicating a missed condition. At time $t_3$, when the input virtual address is removed, the voltage on sense line 76 experiences a instantaneous drop. The drop may be on the order of 450 millivolts and may cause the sense line voltage to a valua below low ground. This presents adverse affects to the operation of the sense line amplifier 74. Namely, when the voltage on the sense line is pulled down to a level below ground (VSS) the drains of transistors within compare circuitry of the CAM cells are at a potential less than that of the substrate. As a result, the diode made up by the substrate and the drain may be forward biased causing charge injection from the substrate. This is undesirable and in an extreme case could cause latch up which may adversely affect future operation of the CAM cell.

At time $t_5$, the precharge signal once again is asserted thereby charging sense line 76 to its precharge level. Clearly, during each sense period between $t_2$ and $t_5$, the sense amplifier may detect a false miss due to charge leaking from sense line 76. Moreover, the negative voltage spike on the sense line may cause further adverse effects.

SUMMARY OF THE INVENTION

The present invention addresses the problems of the prior art mentioned above and others, and provides a plurality of minor sense amplifier circuits coupled to one or more major sense amplifier circuits via a plurality of major sense lines. Inputs to the minor sense amplifiers are coupled to one or more minor sense lines. The minor sense amplifiers sense voltage variations on the minor sense amplifiers and generate an output signal as a function thereof. The major sense amplifier senses voltage variations on the major sense line and generates an output signal as a function thereof.

The present invention, in one embodiment, is employed within a translation lookaside buffer having an array of CAM cells. Each of the minor sense lines is coupled to at least two CAM cells and one minor sense input node. A minor sense precharging device is coupled to each minor sense line. The minor sense precharging device operates to selectively precharge each minor sense line to a first predetermined voltage. At least one major sense line is coupled to at least two minor sense amplifiers and an input of a major sense amplifier. A major sense precharging device is coupled to the major sense line. The major sense precharging device operates to selectively precharge the major sense line to the first predetermined voltage.

The translation lookaside buffer is configured to determine whether an input virtual address matches the contents of a row of CAM cells. If a match occurs, a corresponding physical address is output from an array of RAM cells. In operation, a match or miss signal is produced on one or more minor sense lines in a row corresponding to a row of CAM cells. The match signal is produced on all the minor sense lines in the row when an input virtual address matches the contents of the row of CAM cells. In contrast, a miss signal is produced on art least one of the minor sense lines in the row when the input virtual address does not match the contents of the row of CAM cells. At least two minor sense amplifying circuits sense the miss and match signals produced on separate minor sense lines, and generate output signals indicative thereof to a single major sense line. The major sense amplifier circuit coupled to the major sense line, in turn, generates an output signal depending on the voltage variation on the major sense line.

At least one minor sense line has a first and second keeper circuit coupled thereto. The first keeper circuit is configured to maintain the first predetermined voltage on the one minor sense line. The second keeper circuit is configured to maintain the second predetermined voltage on the one minor sense line. Likewise, one of the major sense lines has first and second keeper circuits coupled thereto. The first keeper circuit coupled to the one major sense line is configured to maintain the first predetermined voltage on the one major sense line while the second keeper circuit is configured to maintain the second predetermined voltage on the one major sense line.

One advantage of the present invention is that it provides an apparatus for sensing signals on a sense line.

Another advantage of the present invention is that it provides an apparatus for sensing a match or miss signal produced by a line of CAM cells within a translation lookaside buffer.

Another advantage of the present invention is that it provides an apparatus for reducing the time for sensing a match and miss signal within a translation lookaside buffer.

Another advantage of the present invention is that it provides an apparatus which more accurately senses a match or miss signal produced by a row of CAM cells within a translation lookaside buffer.

Yet another advantage of the present invention is that it provides an apparatus for sensing match and miss signals within a translation lookaside buffer using relatively simple circuitry which occupies less area on an integrated circuit when compared with the prior art.

Still another advantage of the present invention is that it provides an apparatus which is more reliable as a result of being less susceptible to process variations.

A further advantage of the present invention is that it provides an apparatus for sensing match and miss signals which is less susceptible to charge leakage on the sense line.

BRIEF DESCRIPTION OF THE DRAWINGS

A better understanding of the present invention can be obtained in the following detailed description of the preferred embodiment as considered in conjunction with the following diagrams in which.

Figure 1:
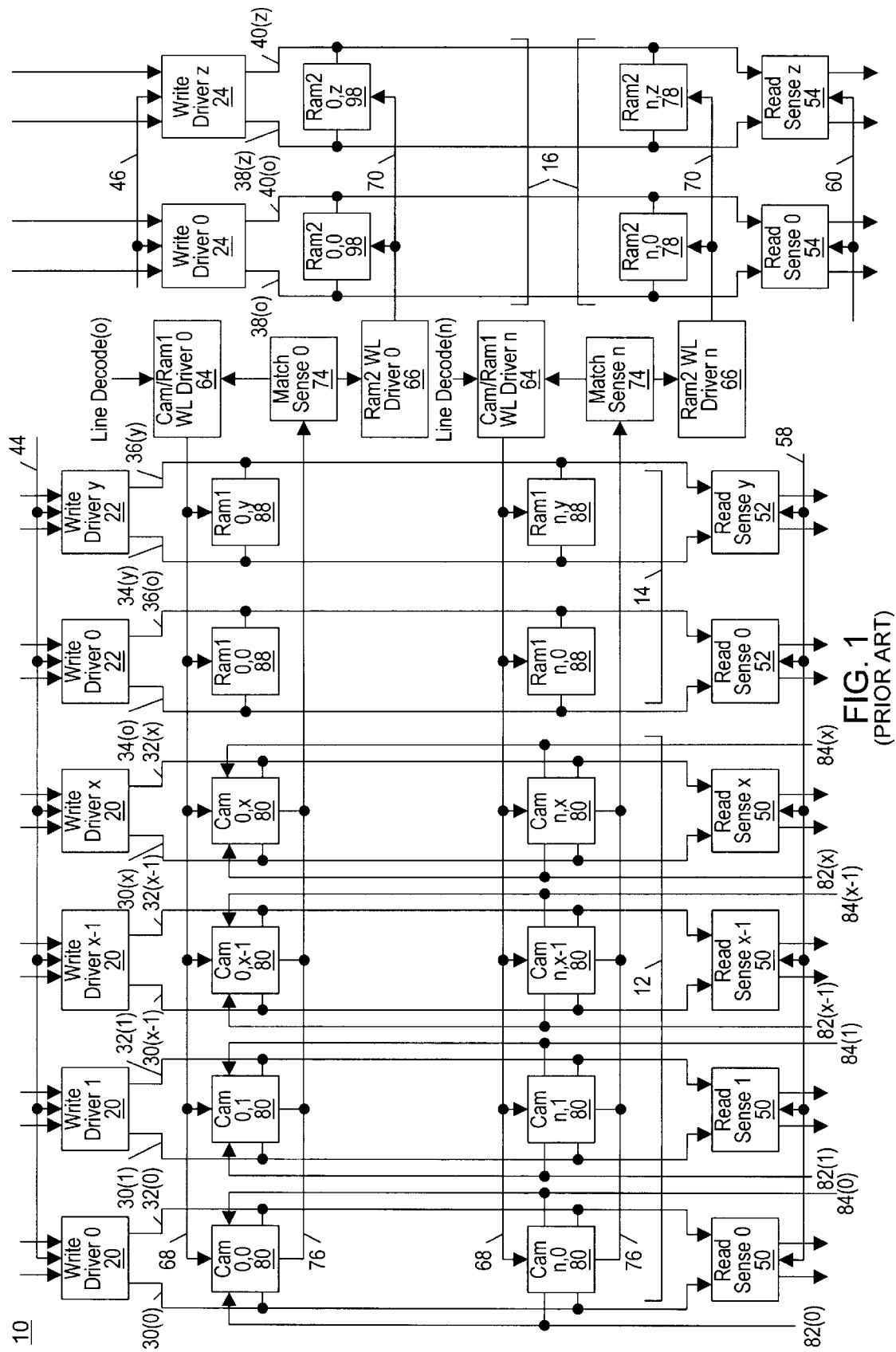
FIG. 1 is a block diagram representing a prior art translation lookaside buffer.

While the invention is susceptible to various modifications and alternative forms, specific embodiments thereof are shown by way of example in the drawings and will be herein be described in detail. It should be understood, however, that the drawings and detailed description thereto are not intended to limit the invention to the particular form described, but on the contrary, the invention is to cover all modifications, equivalents, and alternatives falling within the spirit and scope of the present invention as defined by the appended claims.

DETAILED DESCRIPTION OF THE PREFERRED EMBODIMENTS

Figure 3:
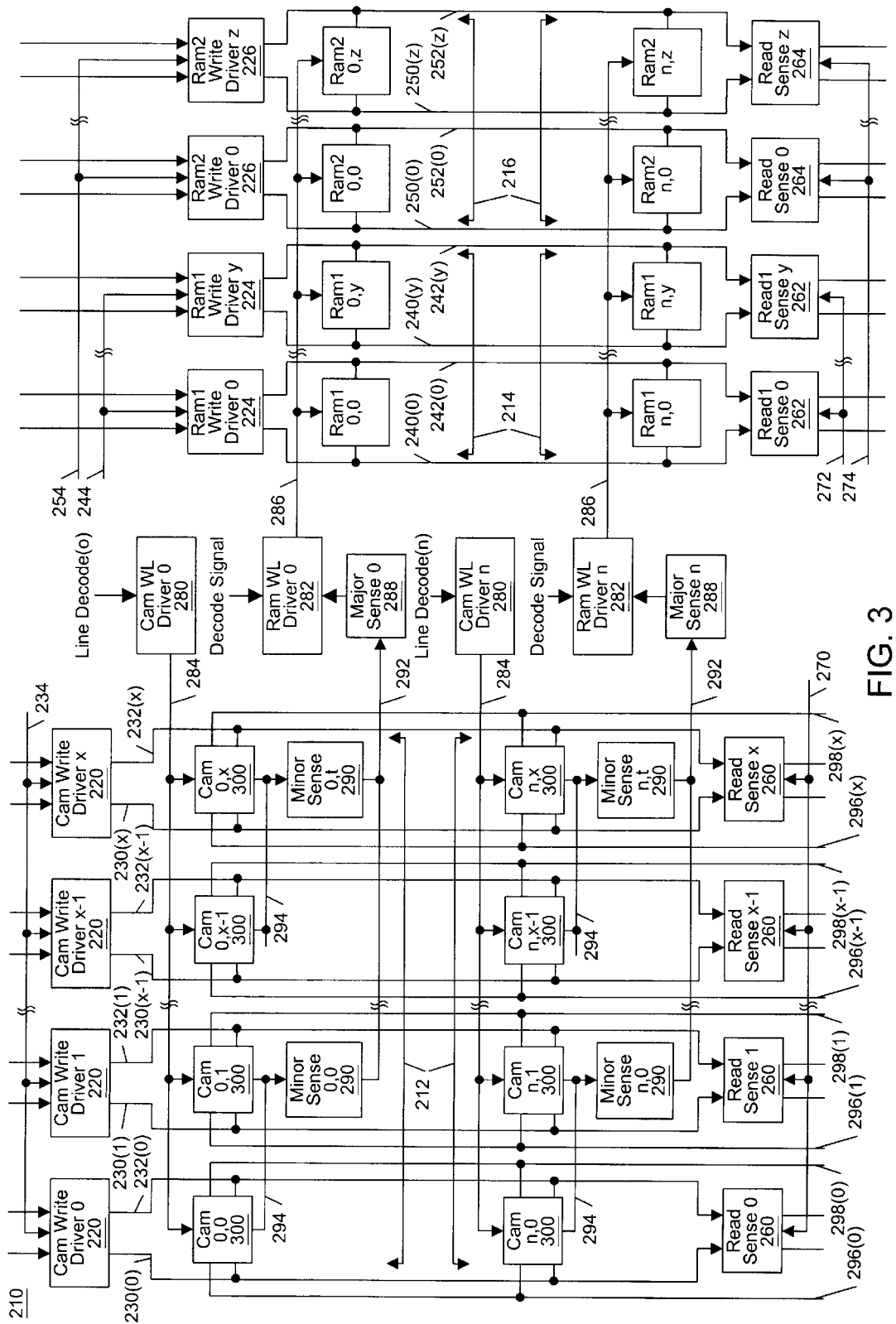
FIG. 3 is a schematic diagram of a translation lookaside buffer employing the present invention.

FIG. 3 shows a block diagram of a translation lookaside buffer (TLB) 210 employing the present invention. It is to be understood, however, that the present invention should not be limited to use within a TLB. Rather, the present invention has application in any integrated circuit in which signals along a conductive line are to be sensed or detected.

TLB 210 includes a CAM array 212, a first RAM array 214, and a second RAM array 216. CAM array 212 includes CAM cells arranged in n rows and x columns. First RAM array 214 includes RAM1 cells arranged in n rows and y columns. A second RAM array 216 includes RAM1 cells arranged in n rows and y columns.

TLB 210 further includes x CAM write drivers 220, y first RAM write drivers 224, and z second RAM write drivers 226. Each CAM write driver 220 has a pair of differential inputs, a control input for receiving a CAM write enable signal, and a pair of differential outputs coupled to a pair of differential CAM bit lines 230 and 232. CAM write drivers 220 are configured to write data to CAM cells within array 212 via bit lines 230 and 232. Each CAM write driver 220 is configured to charge CAM differential bit lines 230 and 232 as a function of a differential input signal when CAM write enable signal is asserted on CAM write enable signal line 234. Each of the first RAM write drivers 224 includes a pair of differential inputs for receiving differential input signals, a control input for receiving a first RAM write enable signal, and a pair of differential outputs coupled to a pair of first RAM differential bit lines 240 and 242. First RAM write drivers 224 are configured to write data to the RAM 1 cells within array 214 via differential bit lines 240 and 242. Each first RAM write driver 224 is configured to charge first RAM differential bit lines 240 and 242 as a function of data signals received at the differential inputs when a second RAM write enable signal is asserted on second RAM write enable signal line 244. Each second RAM write driver 226 includes a pair of differential inputs for receiving differential input signals, a control input for receiving a second RAM write enable signal, and a pair of differential outputs coupled to second RAM differential output lines 250 and 252. Second RAM write drivers 226 are configured to write data to RAM2 cells via differential bit lines 250 and 252. Each second RAM write driver 226 is configured to charge second RAM differential bit lines 250 and 252 as a function of data signals received at the differential inputs when the second RAM write enable signal is asserted on second RAM enable signal 254.

TLB 210 also includes x CAM read sense amplifiers 260, y first RAM read sense amplifiers 262, and z second RAM read sense amplifiers 264. Each CAM read sense amplifier 260 includes a pair of differential inputs coupled to a pair of CAM differential bit lines 230 and 232, a control input for receiving a CAM read enable signal, and a pair of differential outputs. CAM read sense amplifiers 260 are configured to read data stored within the CAM cells via bit lines 230 and 232. Each CAM read sense amplifier 260 generates a pair of differential output values as a function of data received from one of the CAM cells when the CAM read enable signal is asserted on CAM read enable line 270. Each first RAM read sense amplifier 262 has a pair of differential inputs coupled to first RAM differential bit lines 240 and 242, a control input for receiving a first RAM read enable signal, and a pair of differential outputs. First RAM read sense amplifiers 262 configured to read data stored within RAM1 cells via bit lines 240 and 242. Each first RAM read sense amplifier 262 is configured to generate differential output signals as a function of differential input signals received from one of the RAM1 cells when the first RAM read enable signal is asserted on read enable signal line 272. Each second read sense amplifier 264 includes a pair of differential inputs coupled to second RAM differential bit lines 250 and 252, a control input for receiving second RAM read enable signal, and a pair of differential outputs. Second RAM read sense amplifiers 264 are configured to read the contents stored within RAM2 cells via bit lines 250 and 252. Each second RAM read sense amplifier 264 is configured to generate a pair of differential output signals as a function of differential input signals received from one of the RAM2 cells when the second RAM read enable signal is asserted on a second RAM read enable signal line 274.

TLB 210 further includes n CAM word line drivers 280 and n RAM word line drivers 282. Each CAM word line driver 280 has an input for receiving a decoded signal from a line decoder (not shown) and an output coupled to CAM word line 284. It is to be noted that each CAM cell row in CAM array 212 is coupled to a single CAM word line 284, and that no RAM1 or RAM2 cells are coupled to CAM word line 284. CAM word line driver 280 is configured to generate a signal at its output in response to receiving a line decode signal. CAM word line 284 conveys the generated signal to each CAM cell coupled thereto. Access to the CAM cells is enabled in response to the signal generated by CAM word line driver 280. In this manner, the row of CAM cells coupled to CAM lo word line driver 280 can be accessed by write drivers 220 or by read sense amplifiers 260. Each RAM word line driver 282 has an output coupled to a RAM word line 286, a pair of inputs, the first of which is coupled to receive a signal from major match sense amplifier 288, the second of which is configured to receive a decode signal from the decoder (not shown). It is to be noted that each RAM word line 286 is coupled to a row of RAM1 and RAM2 cells. Each RAM word line driver 282 is configured to generate the signal on RAM word line 286 in response to receiving either a signal from major match sense amplifier 288 or from the decoder. Each RAM1 and RAM2 cell coupled to RAM word line 286 receives the RAM word line driver signal, and in response thereto, each RAM1 and RAM2 cell can be accessed by the first and second RAM read sense amplifiers and write drivers.

Lastly, TLB 210 includes an array of minor sense amplifiers 290 arranged in n rows and t columns. Each row of minor match sense amplifiers 290 is coupled to a corresponding major match sense amplifier 288 via a major match sense line 292. Each minor sense amplifier 290 is coupled to at least one CAM cell via minor match sense line 294. To this end, each minor match sense amplifier 290 has an input node coupled to one of the minor match sense lines 294, and an output node coupled to one of the major sense lines 294. Each major match sense amplifier 288 has an input node coupled to one of the major match lines 292, and an output node coupled to a corresponding RAM word line driver 282.

Each minor sense amplifier 290 is configured to detect or sense a match or miss signal present on minor sense line 294 during, for example, an address translation operation within TLB 210. The match signal is presented on all of the minor sense lines in a row when a virtual address provided on differential virtual address lines 296 and 298, matches the contents stored within the corresponding row of CAM cells. The miss signal is presented on one or more of the minor sense lines in the row when the virtual address provided on virtual address lines 296 and 298 do not match contents stored within the row of CAM cells. In response to sensing a match or miss signal on minor match line 294, the minor sense amplifier 290 generates a corresponding minor match signal and minor miss signal. The minor miss signal in effect, discharges the major sense line. The minor match signal operates to maintain the major sense line at its precharge voltage. The major sense amplifier 288 is configured to sense a minor miss or a minor match signal present on major match line 292. Major sense amplifier 288 is configured to generate a major match signal or a major miss signal corresponding to the minor match or minor miss signal present on major match line 292. A major signal outputted by major sense amplifier 288 directs the corresponding RAM word line driver 282 to generate a signal on RAM word line 286 which activates a corresponding row of RAM1 and RAM2 cells to allow access thereto.

CAM array 212, as noted above, includes CAM cells 300 each of which is coupled to a CAM word line 284 for receiving the word line signal from word line driver 280, differential virtual address lines 296 and 298 for receiving a differential virtual address inputted to TLB 210, CAM differential bit lines 230 and 232 which provide read and write access, and minor match lines 294 each of which is coupled to one of the minor sense amplifiers 290 as mentioned above. The first RAM array 214 includes RAM1 cells 302, each of which is coupled to one of the RAM word line drivers 282 for receiving the word line driver signal from word line driver 282, and to first RAM differential bit lines 240 and 242 which provide read and write access. Likewise, second RAM array 216 includes RAM2 cells 304 each of which is coupled to a RAM word line 282 for receiving a signal from RAM word line driver 282, and to a pair of second RAM differential bit lines 250 and 252 which provide read and write access. The RAM1 cells 302 and the RAM2 cells 304 are virtually identical. However, it is to be noted that while each RAM1 and RAM2 cell within a row is coupled to the same word line 286, the RAM1 cells can be accessed independently from the RAM2 cells as will be more fully described below.

CAM cells 300 store a plurality of virtual addresses to be compared against input virtual addresses. RAM2 cells store a plurality of matching physical addresses. RAM1 cells store plurality of special bits used in translating virtual addresses to physical addresses. The special bits may include information associated with size, writeability, error check, etc. In a translation operation, a multi-bit virtual address is provided by a CPU (not shown) to differential bit lines 296 and 298. The input virtual address is compared against the contents stored in each row of CAM cells 300. If one of the rows of CAM cells contains an address which matches the input virtual address, a match signal is presented on each of the minor sense lines 294 in that row. If the input virtual address does not match the contents within the row of CAM cells, a miss signal will be presented on one of more minor sense lines 294 in that row. When one minor sense line 294 is provided with a miss signal during address translation, the minor sense amplifier 290 coupled thereto will produce a minor miss signal on major sense line 292. Major sense amplifier 288, in response, generates a major miss signal. Ultimately, if the input virtual address equals the contents stored within a row of CAM cells, only one of the major sense amplifiers 288 will generate a major match signal which in turn directs the corresponding word line driver 282 to generate a signal which activates a corresponding row of RAM1 and RAM2 cells. The remaining major sense amplifiers generate a major miss signal. Once a row of RAM1 and RAM2 cells are activated, the special bits and physical address stored therein are read by read sense amplifiers 262 and 264, the outputs of which are concatenated to form the translated physical address.

Figure 4:
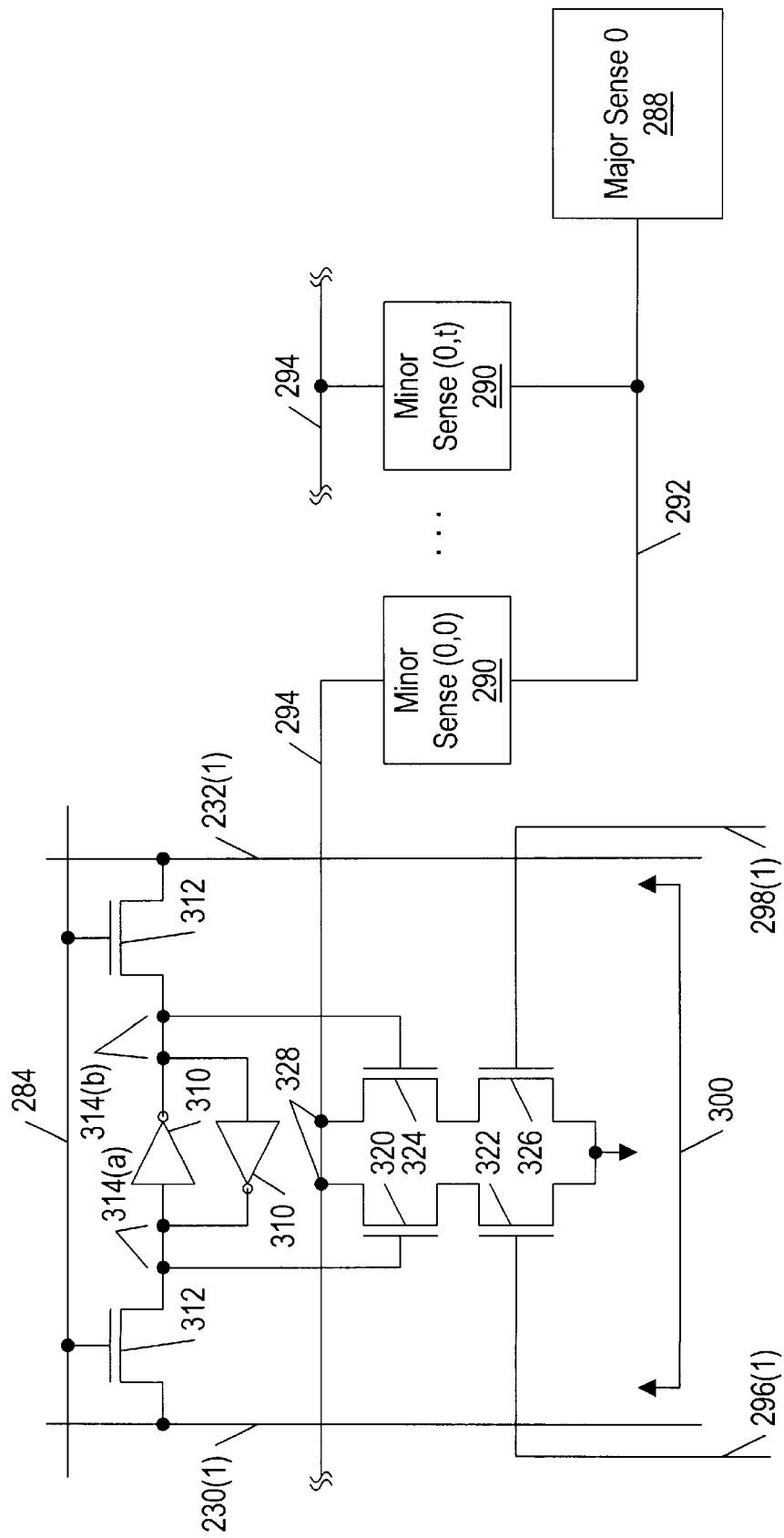
FIG. 4 is a block diagram of the present invention employed in connection with one of the CAM cells of FIG. 3.

FIG. 4 shows schematic of a CAM cell 300, and several minor sense amplifiers 290 of a row coupled to one of the major sense amplifiers 288. CAM cell 300 includes a latch defined by a pair of cross-coupled inverters 310, the combination of which is positioned between a pair of pass gates 312. The combination of inverters 310 and pass gates 312 define circuitry commonly known in the art as a T6 cell. Pass gates 312 are coupled to CAM word line 284. In response to a signal from CAM word line driver 280, pass gates 312 couple nodes 314 to CAM differential bit lines 230 and 232. With the pass gates activated, the signals at nodes 314 can be updated by one of the CAM write drivers or read by one of the CAM read sense amplifiers.

CAM cell 300 further includes match circuitry 316 having four n channel field effect transistors 320–326. The gates of transistors 322 and 326 are coupled to virtual address lines 296 and 298 while the gates of transistors 320 and 324 are coupled to nodes 314($a$) and 314($b$). Match circuitry 316 is coupled between minor sense line 294 at miss/match node 298 and ground. Minor sense line 294 is precharged to a first predetermined voltage before each virtual address translation cycle. Match circuitry 316 is configured to discharge minor sense line 294 to ground, thus creating a miss signal, when the differential virtual address bit input does not equate to differential address stored on nodes 314($a$) and 314($b$). If the differential bit input equates to the signal stored on nodes 314, then match circuitry 316 will not activate to discharge minor sense line 294, thus maintaining the precharge voltage thereon as a match signal. Likewise, major sense line 292 is precharged to a first predetermined voltage prior to each virtual address translation cycle. If any of the minor sense amplifiers 290 coupled thereto, sense a miss signal on one or more minor sense lines 294, those minor sense amplifiers 290 will operate to discharge major match line 292 to ground thus creating the major match signal. In contrast, if all the minor sense amplifiers 290 in a row sense a match signal present on the corresponding row of minor sense lines 294, none of the minor sense amplifiers 290 will activate to discharge the predetermined voltage on major sense line 292 thus creating the minor match signal thereon.

Figure 2:
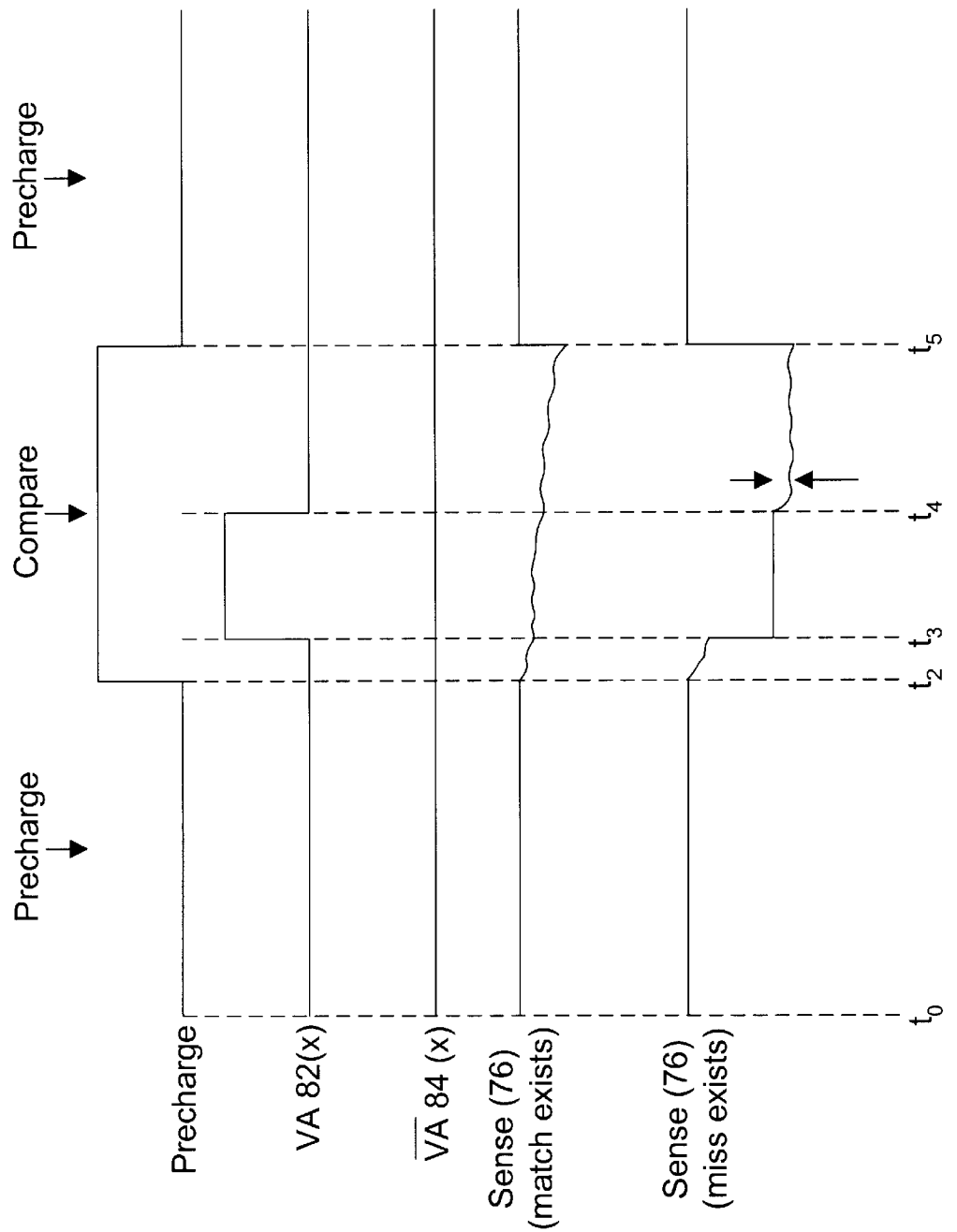
FIG. 2 is a timing diagram illustrating one operational aspect of the prior art translation lookaside buffer of FIG. 1.

As can be seen in FIGS. 3 and 4, each row of CAM cells is coupled to at least two minor sense line, minor sense amplifier combinations, in effect dividing a long sense line into several shorter sense lines. In contrast, only one sense line is provided for an entire row of CAM cells within the prior art as shown in FIG. 1. Clearly, the RC time constant associated with the smaller minor sense lines of the present invention is less than the RC time constant of the prior art sense line. With the present invention, the precharging operation on the minor sense lines or the discharging operation on the minor sense lines completes in less time. Accordingly, the circuits shown in FIGS. 2 and 3 can operate faster than that shown within the prior art of FIG. 1.

Figure 5:
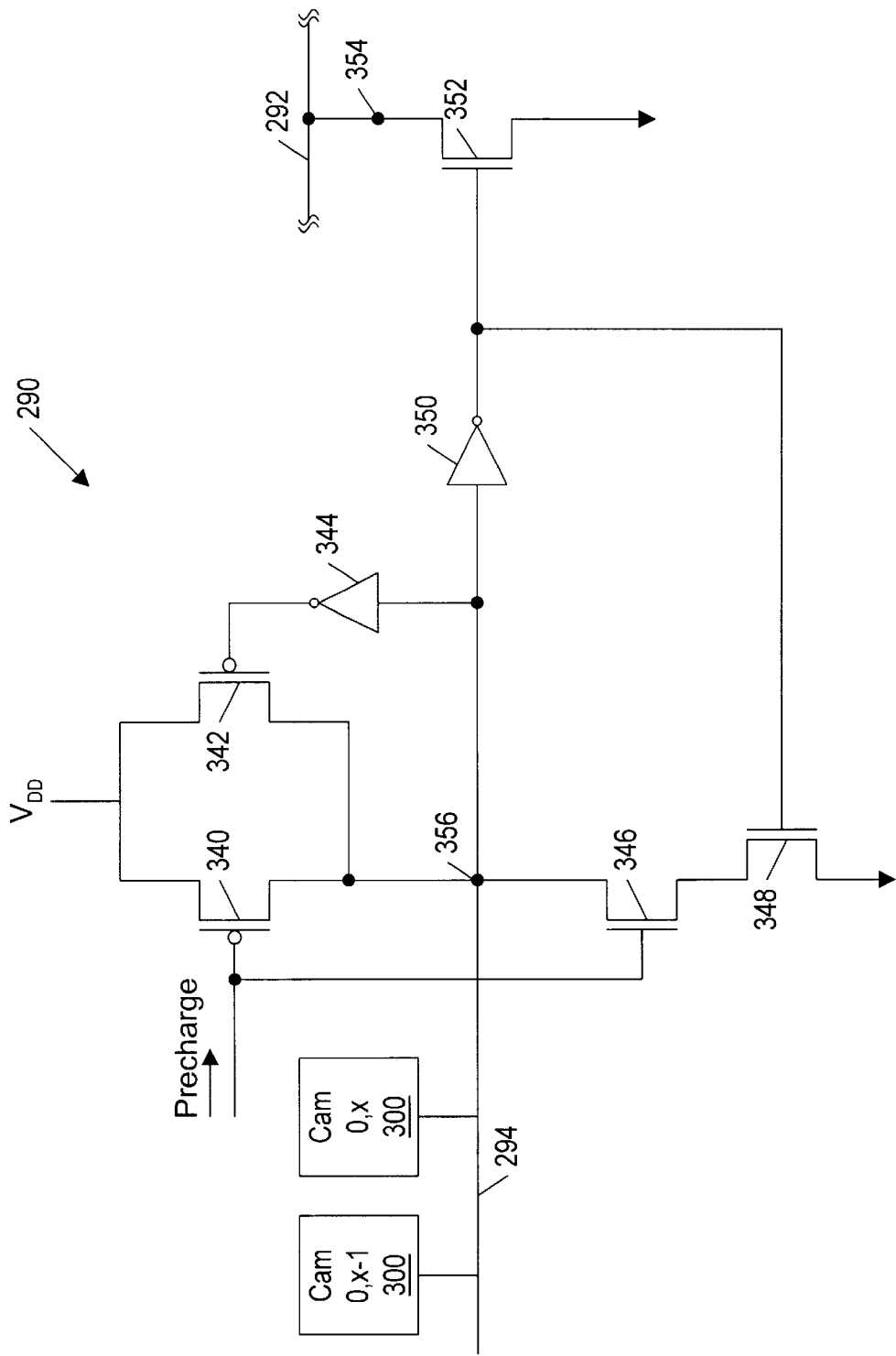
FIG. 5 is a schematic diagram of a minor sense amplifier employing the present invention.

FIG. 5 shows a schematic of a minor sense amplifier 290 coupled to several CAM cells 300. Minor sense amplifier 290 includes a minor sense line precharge device defined, in one embodiment, as a P-channel field effect transistor 340, a first keeper device defined, in one embodiment, as a P-channel field effect transistor 342 coupled to inverter 344, a second keeper defined, in one embodiment, as series coupled and N-channel field effect transistors 346 and 348, a second inverter 350, and an output N-channel field effect transistor 352 coupled between minor sense output node 354 and ground.

P-channel transistor 340 is coupled between a first supply voltage and minor sense input node 356. P-channel transistor 340 activates when an input precharge signal is asserted as a low voltage. In this precharge mode, P-channel transistor 340 conducts current to charge minor sense line 294 to the first predetermined voltage level. When the precharge signal deasserts to a high voltage, P-channel 340 deactivates. However, with sense line 294 precharged to a high predetermined first voltage, P-channel transistor 342 is activated via inverter 344. Once activated, P-channel transistor 342 keeps sense line 294 at the first predetermined voltage in effect guarding against charge leakage which may inadvertently reduce the voltage on sense line 294 to a point below the switch point of inverter 350. P-channel transistor 342 maintains the first predetermined voltage on sense line 294 notwithstansding inadvertent charge leakage. The first predetermined voltage is maintained until it is discharged to a second predetermined voltage by one of the CAM cells 300 during an address translation cycle, thereby creating a miss signal.

When a CAM cell 300 discharges sense line 294 to ground (second predetermined voltage) as a result of a miss condition during the address translation cycle, the low voltage at node 356 deactivates P-channel transistor 342 via inverter 344. In response, inverter 350 outputs a high voltage which in turn activates N-channel transistor 348. N-channel transistor 346 has its gate coupled to the input precharge signal. With precharge signal deasserted to a higher voltage, N-channel transistor 346 activates thereby coupling input node 356 to ground. Combination of N-channel transistors 346 and 348, when activated, operate to maintain sense line 294 at the second predetermined voltage or missed signal level, and prevent a negative voltage spike on sense line 294.

The output of inverter 350 controls output transistor 352. During an address translation cycle, a high voltage at the output of inverter 352 indicates a miss signal on minor sense line 294 which in turn activates output transistor 352 to discharge major sense line 294 thereby creating a minor miss signal thereon. In contrast, a low voltage at the output of inverter 350 indicates a match signal condition on minor sense line 294 which in turn deactivates output transistor 352 thereby maintaining major sense line 294 at its precharged voltage level thereby creating a minor match signal.

Figure 6:
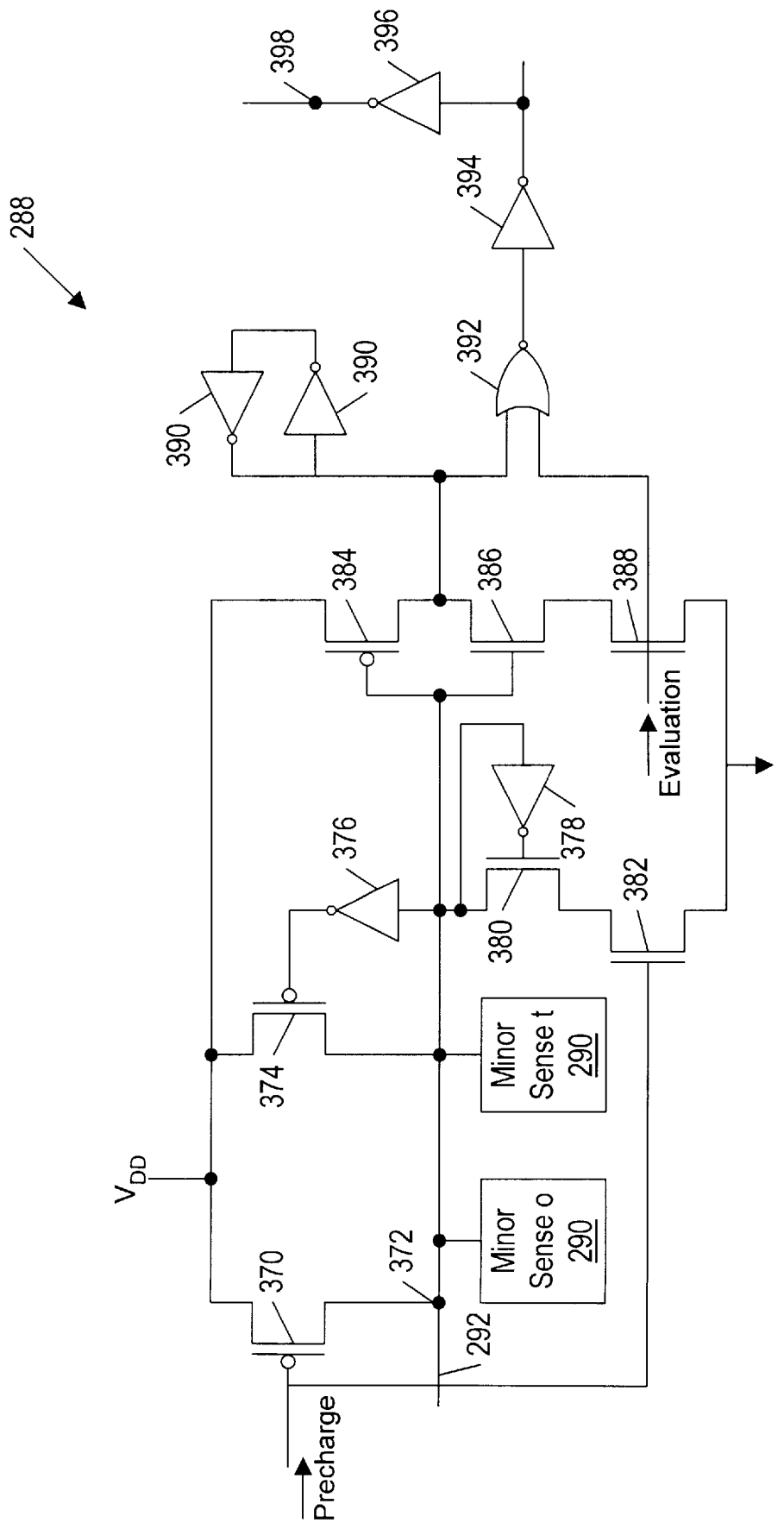
FIG. 6 is a schematic diagram of a major sense amplifier employing the present invention.

FIG. 6 shows a schematic diagram of a major sense amplifier 288 coupled to at least two minor sense amplifiers 290 within the same row. Major sense amplifier 288 includes a precharge device defined, in one embodiment, as a P-channel field effect transistor 370 coupled between the first supply voltage and major sense input node 372, a first keeper device defined, in one embodiment, as P-channel field effect transistor 374 controlled by inverter 376, a second keeper device defined, in one embodiment, as inverter 378 and N-channel field effect transistors 380 and 382, a selectably enabled inverter defined, in one embodiment, as series connected transistors 384–388, a latch defined, in one embodiment, as a pair of cross-coupled inverters 390, NOR gate 392, and a pair of output inverters 394 and 396.

P-channel transistor 370 activates in response to the input precharge signal asserted as a low voltage, to conduct current to charge major sense line 292 to the first predetermined voltage during a precharge phase before each virtual address translation cycle. After major sense line 292 is precharged, the input precharge signal deactivates to a high voltage thereby deactivating P-channel transistor 370. However, the high first predetermined voltage on major sense line 292 activates P-channel transistor 374 via inverter 376, thereby conducting current to major sense line 292. Like the first keeper device shown in FIG. 5, P-channel transistor operates to maintain the first predetermined voltage on major sense line 292 and guard against inadvertent charge leakage which may degrade the voltage and produce a false minor miss signal.

When the input precharge signal deactivates to a high voltage, N-channel transistor 382 is activated. In an address translation cycle, one of the minor sense amplifiers 290 may operate to discharge major match line 292 to ground (second predetermined voltage) thereby providing a minor miss signal thereon. The low voltage on major sense line 292 activates N-channel transistor 380 via inverter 378 thereby preventing a negative voltage spike on major sense line 292.

Major sense amplifier 288 generates a major match signal at output node 398 in response to a minor match signal on minor match line 292 during a virtual address translation cycle. In contrast, major sense amplifier 298 generates a major miss signal at output 398 in response to a minor miss signal present upon minor match line 292. However, the signals outputted by major sense amplifier 288 are not valid until the evaluation signal to N-channel field effect transistor 388 and NOR gate 392, has cycled from a high to low voltage With N-channel transistor 388 activated by evaluation signal asserted as a high voltage, the series combination of P-channel transistor 384 and N-channel transistor 386 invert the voltage on major sense line 372. The inverted voltage is inputted to NOR gate 392 and is latched by inverters 390. With the evaluation signal deasserts to a low voltage, NOR gate 392 acts as an inverter to the voltage signal latched by inverters 390. In effect, the second keeper circuit, latch, and NOR gate 392 is a timed circuit which, in connection with output inverters 394 and 396, generate the major match and major miss signal at output node 398.

The foregoing description of the invention is illustrative and explanatory thereof, and various changes in the apparatus or method may be made without departing from the invention as set forth in the following claims.

What is claimed is:

1. A translation lookaside buffer comprising:
   a cam array for storing x-bit virtual addresses, the cam array having n rows and x columns of cam cells, each cam cell having an input node for receiving a virtual address bit signal, and a cam miss/match node;
   n rows of minor sense amplifier circuits, each minor sense amplifier circuit having a minor sense input node, and a minor sense miss/match node;

n rows of minor sense lines, each minor sense line being coupled to at least two cam cell miss/match nodes and to one minor sense input node;

a minor sense precharging device coupled to each minor sense line, wherein the minor sense precharging devices selectively conduct current to precharge the minor sense lines to a first predetermined voltage;

n major sense amplifier circuits, each major sense amplifier circuit having a major sense input node, and a major sense miss/match node;

n major sense lines, each major sense line being coupled to at least two minor sense miss/match nodes of at least two minor sense amplifier circuits, respectively, and one major sense input node of a major sense amplifier circuit; and a major sense precharging device coupled to each major sense line, wherein the major sense precharging devices selectively conduct current to precharge the major sense lines to the first predetermined voltage.

2. The translation lookaside buffer of claim 1 wherein:

each cam cell coupled to a minor sense line is configured to selectively discharge the minor sense line to a second predetermined voltage; and each minor sense amplifier circuit coupled to a major sense line is configured to selectively discharge the major sense line to the second predetermined voltage.

3. The translation lookaside buffer of claim 2 further comprising:

a first keeper circuit coupled to at least one of the minor sense lines, for maintaining the first predetermined voltage thereon until at least one of the cam cells discharges the one minor sense line to the predetermined second voltage; and a second keeper circuit coupled to the one minor sense line, for maintaining the second predetermined voltage thereon after the one cam cell discharges the one minor sense line to the second predetermined voltage.

4. The translation lookaside buffer of claim 2 further comprising:

a first keeper circuit coupled to at least one of the major sense lines, for maintaining the first predetermined voltage thereon until at least one of the minor sense amplifier circuits discharges the one major sense line to the predetermined second voltage; and a second keeper circuit coupled to the one major sense line, for maintaining the second predetermined voltage thereon after the one minor sense amplifier circuit discharges the one major sense line to the second predetermined voltage.

5. A memory circuit comprising:

a cam array having n rows and x columns of cam cells, a first cam cell having a miss/match node coupled to a minor match line, an input node for receiving a signal, wherein the first cam cell is configured to generate a first cam match signal at the miss/match node when the received signal matches a bit signal stored in the first cam cell;

n rows of minor sense amplifier circuits, a first minor sense amplifier circuit having a minor sense input node coupled to the minor match line, and a minor sense output node coupled to a major sense line, wherein the first minor sense amplifier circuit is configured to generate a first minor match signal at the minor sense output node in response to the minor sense input node receiving the first cam match signal; and n major sense amplifier circuits, a first major sense amplifier circuit having a major sense input node coupled to the major sense line, and a major sense output node, wherein the first major sense amplifier circuit is configured to generate a major match signal at the major sense output node in response to the major sense input node receiving the minor match signal.

6. The memory circuit of claim 5 further comprising:

a second cam cell having a second miss/match output node coupled to the minor match line, a second input node for receiving a second signal, wherein the second cam cell is configured to generate a second cam match signal at the second miss/match output node when the received second signal matches a second bit signal stored in the second cam cell; and wherein the first minor sense amplifier circuit is configured to generate the first minor match signal at the minor sense output node in response to the first minor sense input node receiving the first and second cam match signals.

7. The memory circuit of claim 6 wherein the first minor sense amplifier circuit is configured to generate the first minor match signal upon simultaneously receiving the first and second cam match signals.

8. The memory circuit of claim 6 further comprising:

a third cam cell having a third miss/match output node coupled to a second minor match line, a third input node for receiving a third signal, wherein the third cam cell is configured to generate a third cam match signal at the third miss/match output node when the received third signal matches a third bit signal stored in the third cam cell;

a fourth cam cell having a fourth miss/match output node coupled to the second minor match line, a fourth input node for receiving a fourth signal, wherein the fourth cam cell is configured to generate a fourth cam match signal at the fourth miss/match node when the received fourth signal matches a fourth bit signal stored in the fourth cam cell; and a second minor sense amplifier circuit having a second minor sense input node coupled to the second minor match line, and a second minor sense output node coupled to the major sense line, wherein the second minor sense amplifier circuit is configured to generate a second minor match signal at the second minor sense output node in response to the second minor sense input node simultaneously receiving the third and fourth cam match signals.

9. The memory circuit of claim 8 wherein the first, second, third, and fourth cam cells are contained in the same row of cam cells, and wherein the first and second minor sense amplifier circuits are contained in the same row of sense amplifier circuits.

10. The memory circuit of claim 6 wherein:

the first cam cell is configured to generate a first cam miss signal at the miss/match node when the first signal does match the bit signal stored in the first cam cell;

the second cam cell is configured to generate a second cam miss signal at the second miss/match output node when the second signal does not match the second bit signal stored in the second cam cell;

the first minor sense amplifier circuit is configured to generate a minor miss signal at the minor match output in response to the minor sense amplifier circuit receiving the first cam miss signal or the second cam miss signal; and the major sense amplifier circuit is configured to generate a major miss signal at the major sense output node in response to the major sense amplifier circuit receiving the minor miss signal.

11. The memory circuit of claim 8 wherein:

the first cam cell is configured to generate a first cam miss signal at the miss/match node when the first signal does match the bit signal stored in the first cam cell;

the second cam cell is configured to generate a second cam miss signal at the second match output node when the second virtual address signal does not match the second bit signal stored in the second cam cell;

the third cam cell is configured to generate a third cam miss signal at the third miss/match node when the third signal does match the third bit signal stored in the third cam cell;

the fourth cam cell is configured to generate a fourth cam miss signal at the fourth miss/match node when the fourth signal does match the fourth bit signal stored in the fourth cam cell;

the minor sense amplifier circuit is configured to generate a first minor miss signal at the minor sense output node in response to the minor sense amplifier circuit receiving the first cam miss signal or the second cam miss signal;

the second minor sense amplifier circuit is configured to generate a second minor miss signal at the second minor sense output node in response to the second minor sense amplifier circuit receiving the third cam miss signal or the fourth cam miss signal; and the major sense amplifier circuit is configured to generate a major miss signal at the major sense output node in response to the major sense amplifier circuit receiving the first minor miss signal or the second minor miss signal.

12. The memory circuit of claim 5 wherein the first minor sense amplifier circuit comprises:

a precharge device coupled between a first supply voltage and the minor sense line, wherein the precharge device is configured to receive a precharge signal, and in response to receiving the precharge signal, the precharge device precharges the minor sense line to a first predetermined voltage;

a first inverter having an input coupled to the minor sense line, and an output;

a first transistor for selectively coupling the minor sense output node to a second supply voltage, the first transistor having a gate coupled to the output of the first inverter; and a first keeper device coupled between the first supply voltage and the minor sense line, the first keeper device configured to maintain the first predetermined voltage on the minor sense line.

13. The memory circuit of claim 12 wherein the first keeper device comprises:

a second inverter having an input coupled to the minor sense line, and an output; and a second transistor for selectively coupling the first supply voltage to the minor sense line, the second transistor having a gate coupled to the second inverter output.

14. The memory circuit of claim 13 wherein:

the first cam cell is configured to discharge the minor sense line to a second predetermined voltage when the first signal does not match the bit signal stored in the first cam cell; and the first minor sense amplifier circuit further comprises a second keeper device coupled between the minor sense line and the second supply voltage, wherein the second keeper device is configured to maintain the second predetermined voltage on the minor sense line.

15. The memory circuit of claim 14 wherein the second keeper circuit comprises a third and fourth transistors coupled in series, for selectively coupling the minor sense line and the second supply voltage, the third transistor having a gate configured to receive the precharging signal, the fourth transistor having a gate coupled to the output of the first inverter.

16. The memory circuit of claim 15 wherein the precharge device is defined by an n-channel field effect transistor, and the third transistor is a p-channel field effect transistor.

17. The memory circuit of claim 16 wherein the first major sense amplifier comprises a second precharge device coupled between the first supply voltage and the major sense line, wherein the second precharge device is configured to receive the precharge signal, and in response to receiving the precharge signal, the second precharge device precharges the major sense line to the first predetermined voltage; and a third keeper device coupled between the first supply voltage and the major sense line, the third keeper device configured to maintain the first predetermined voltage on the major sense line.

18. The memory circuit of claim 14 wherein the third keeper device comprises:

a fifth transistor coupled between the first supply voltage and the major sense line; and a third inverter having an input coupled to the major sense line, and an output coupled to a gate of the fifth transistor.

19. The memory circuit of claim 15 wherein:

the first minor sense amplifier circuit is configured to discharge the major sense line to the second predetermined voltage in response to the first minor sense amplifier circuit receiving the first cam miss signal; and the first major sense amplifier circuit further comprises a fourth keeper device coupled between the major sense line and the second supply voltage, wherein the second keeper device is configured to maintain the second predetermined voltage on the major sense line.

20. The memory circuit of claim 19 wherein the fourth keeper comprises:

a fourth inverter having an input coupled to the major sense line, and an output; and fifth and sixth transistors coupled in series between the major sense line and the second supply voltage, the fifth transistor having a gate coupled to the output of the fourth inverter, the sixth transistor having a gate configured to receive the precharge signal.

21. The memory circuit of claim 20 wherein the second precharge device is defined as a p-channel field effect transistor, and the sixth transistor is an n-channel field effect transistor.

22. The memory circuit of claim 21 wherein the first major sense amplifier circuit further comprises:

a selectively enabled inverter having an input coupled to the major sense line, an output, and a control input for receiving an enabling signal, wherein the selectively enabled inverter generates an inverted major match signal in response to receiving the enabling signal;

a latch coupled to the output of the selectively enabled inverter, for storing the inverted major match signal;

a nor gate having a first nor gate input coupled to the output of the selectively enabled inverter and a second nor gate input configured to receive the enabling signal and fifth and sixth inverters coupled between an output of the nor gate and the major sense output node.

23. A translation lookaside buffer comprising:

a cam array for storing x-bit addresses, the cam array having n rows and x columns of cam cells, each cam cell storing an address bit signal and having an input node for receiving an input address bit signal, and a cam output node for outputting an output signal indicating whether the input address bit signal equals the stored address bit signal;

n rows of first sense amplifier circuits, each first sense amplifier circuit having a first input node, and a first output node;

n rows of first lines, each first line being coupled to at least two of the cam cell output nodes and to one first input node;

a first precharging circuit coupled to each first line, wherein the first precharging circuits selectively conduct current to precharge the first sense lines to a first voltage;

n second sense amplifier circuits, each second sense amplifier circuit having a second input node, and a second output node;

n second lines, each second line being coupled to at least two first output nodes of at least two first sense amplifier circuits, respectively, and one second input node of a second sense amplifier circuit; and a second precharging circuit coupled to each second line, wherein the second precharging circuit selectively conducts current to precharge the second lines to the first voltage.

24. The translation lookaside buffer of claim 23 wherein:

each cam cell coupled to a first line is configured to selectively discharge the first line to a second voltage; and each first sense amplifier circuit coupled to a second line is configured to selectively discharge the second line to the second voltage.

25. The translation lookaside buffer of claim 24 further comprising:

a first circuit coupled to at least one of the first lines for maintaining the first voltage thereon until at least one of the cam cells discharges the at least one of the first lines to the second voltage; and a second circuit coupled to the at least one of the first lines for maintaining the second voltage thereon after the at least one of the cam cells discharges the at least one of the second lines to the second voltage.

26. The translation lookaside buffer of claim 24 further comprising:

a first circuit coupled to at least one of the second lines for maintaining the first voltage thereon until at least one of the first sense amplifier circuits discharges the at least one of the second sense lines to the second voltage; and a second circuit coupled to the at least one of the second lines for maintaining the second voltage thereon after the at least one of the first sense amplifier circuits discharges the at least one of the second lines to the second voltage.

* * * * *